United States Patent
Friese

(10) Patent No.: US 10,254,158 B2
(45) Date of Patent: Apr. 9, 2019

(54) MODULES HAVING MULTIPLE OPTICAL CHANNELS INCLUDING OPTICAL ELEMENTS AT DIFFERENT HEIGHTS ABOVE THE OPTOELECTRONIC DEVICES

(71) Applicant: Heptagon Micro Optics Pte. Ltd., Singapore (SG)

(72) Inventor: Christoph Friese, Wannweil (DE)

(73) Assignee: ams Sensors Singapore Pte. Ltd., Singapore (SG)

( * ) Notice: Subject to any disclaimer, the term of this patent is extended or adjusted under 35 U.S.C. 154(b) by 134 days.

(21) Appl. No.: 15/036,363

(22) PCT Filed: Dec. 8, 2014

(86) PCT No.: PCT/SG2014/000584
§ 371 (c)(1),
(2) Date: May 12, 2016

(87) PCT Pub. No.: WO2015/088443
PCT Pub. Date: Jun. 18, 2015

(65) Prior Publication Data
US 2016/0282176 A1    Sep. 29, 2016

Related U.S. Application Data

(60) Provisional application No. 61/913,679, filed on Dec. 9, 2013.

(51) Int. Cl.
*G01J 1/02* (2006.01)
*G01J 1/04* (2006.01)
(Continued)

(52) U.S. Cl.
CPC ......... *G01J 1/0411* (2013.01); *G01J 1/0214* (2013.01); *G01J 1/0271* (2013.01); *G01J 1/0422* (2013.01);
(Continued)

(58) Field of Classification Search
CPC ...... G01S 17/026; G01S 7/481; G01S 7/4811; G01S 7/4813
See application file for complete search history.

(56) References Cited

U.S. PATENT DOCUMENTS 6,642,505 B1 * 11/2003 Nakano .................. A47K 13/24
250/216
9,237,264 B2   1/2016 Rudmann et al.
(Continued)

FOREIGN PATENT DOCUMENTS

CN      103229084 A      7/2013
DE  10 2011 105374 A1  12/2012
(Continued)

OTHER PUBLICATIONS

Australian Patent Office, International Search Report and Written Opinion, issued by ISA/AU in International Patent Application No. PCT/SG2014/000584 (dated Mar. 3, 2015).

*Primary Examiner* — Thanh Luu
(74) *Attorney, Agent, or Firm* — Fish & Richardson P.C.

(57) ABSTRACT

An optoelectronic module has multiple optical channels each of which includes a respective optical element at a different height within the module. The modules can include channels arranged side-by-side where each channel is covered by a respective cover that is optically transmissive to one or more wavelengths of light emitted by or detectable by the optoelectronic devices in the module. The transmissive covers, which respectively can include one or more passive optical elements on their surfaces, are disposed at different heights within the module.

11 Claims, 13 Drawing Sheets

(51) Int. Cl.
    *H01L 25/16*     (2006.01)
    *G02B 19/00*     (2006.01)
    *G02B 3/00*     (2006.01)
    *G01J 1/42*     (2006.01)
    *H01L 33/58*     (2010.01)

(52) U.S. Cl.
    CPC .............. *G01J 1/42* (2013.01); *G02B 3/0043* (2013.01); *G02B 3/0075* (2013.01); *G02B 19/0014* (2013.01); *G02B 19/0085* (2013.01); *H01L 25/167* (2013.01); *H01L 33/58* (2013.01); *H01L 2924/0002* (2013.01)

(56) References Cited

U.S. PATENT DOCUMENTS

| | | |
|---|---|---|
| 9,269,848 B2 | 2/2016 | Lermer et al. |
| 2003/0025082 A1 | 2/2003 | Brewington et al. |
| 2005/0270653 A1 | 12/2005 | Boettinger et al. |
| 2007/0166050 A1 | 7/2007 | Horio et al. |
| 2008/0170220 A1* | 7/2008 | Sawayama ............. G01N 21/55 356/73 |
| 2010/0045963 A1 | 2/2010 | Yamaguchi et al. |
| 2011/0013292 A1* | 1/2011 | Rossi ................ H01L 27/14621 359/738 |
| 2011/0141585 A1 | 6/2011 | Kuo |
| 2013/0019461 A1 | 1/2013 | Rudmann et al. |
| 2013/0153772 A1* | 6/2013 | Rossi .................... G01S 17/026 250/353 |
| 2013/0264586 A1 | 10/2013 | Rudmann et al. |

FOREIGN PATENT DOCUMENTS

| | | |
|---|---|---|
| EP | 2650705 | 10/2013 |
| TW | 201133725 A | 10/2011 |
| WO | 2011/156928 | 12/2011 |
| WO | WO 2012/175631 | 12/2012 |
| WO | 2014/014416 | 1/2014 |

\* cited by examiner

MODULES HAVING MULTIPLE OPTICAL CHANNELS INCLUDING OPTICAL ELEMENTS AT DIFFERENT HEIGHTS ABOVE THE OPTOELECTRONIC DEVICES

TECHNICAL FIELD

This disclosure relates to optoelectronic modules and fabrication techniques for manufacturing such modules.

BACKGROUND

Smartphones and other devices sometimes include miniaturized optoelectronic modules such as light modules, sensors or cameras. More generally, various optoelectronic modules may be integrated into a wide range of small electronic devices, such as bio devices, mobile robots, surveillance cameras, camcorders, laptop computers, and tablet computers, among others. For example, an optical proximity sensor can be provided in a mobile phone or other handheld device to detect the position or location of an object. Such sensor modules typically have a light emission channel and a separate light detection channel. In some cases, the optical requirements for the two channels may differ.

SUMMARY

This disclosure describes various optoelectronic modules that have multiple optical channels each of which includes a respective optical element at a different height within the module. Thus, some modules can include, for example, two channels, arranged side-by-side, where each channel is covered by a respective cover that is optically transmissive to one or more wavelengths of light emitted by or detectable by the optoelectronic devices in the module. The transmissive covers, which respectively can include one or more passive optical elements on their surfaces, are disposed at different heights within the module. For example, a first transmissive cover can be positioned at a first height above a support substrate on which the optoelectronic devices are mounted, whereas a second transmissive cover can be positioned at a second different height above the support substrate.

In some implementations, providing the transmissive covers at different heights can facilitate providing different focal lengths for the optical channels or can facilitate adjusting the focal lengths for the different channels.

In one aspect, for example, an optoelectronic module includes a support substrate on which are mounted first and second optoelectronic devices. A first transmissive cover is disposed over the first optoelectronic device at a first height above the support substrate, and a second transmissive cover is disposed over the second optoelectronic device at a second height above the support substrate, where the second height is different from the first height. Exterior walls laterally encircle the first and second optoelectronic devices and are composed of a material that is non-transparent to one or more wavelengths of light emitted by or detectable by the first and second optoelectronic devices. An interior wall separates the first and second optoelectronic devices from one another and is composed of the same material as the exterior walls.

This disclosure also describes various fabrication techniques for making the modules. In some implementations, wafer-level techniques can be used. Further, various features can be formed, for example, by replication or vacuum injection. Thus, according to one aspect, a method of fabricating optoelectronic modules includes supporting a plurality of singulated transmissive substrates in a combined replication and vacuum injection tool. Various ones of the singulated transmissive substrates are supported at a first height and other ones of the singulated transmissive substrates are supported at a second different height. The method includes replicating passive optical elements onto at least one side of each singulated transmissive substrate while the singulated transmissive substrates are supported in the combined replication and vacuum injection tool. A vacuum injection technique is used to form a respective spacer feature on a first side of each singulated transmissive substrate and a respective baffle feature on a second side of each singulated transmissive substrate, and to form interior wall features separating adjacent ones of the singulated transmissive substrates from one another, while the singulated transmissive substrates are supported in the combined replication and vacuum injection tool. The method further includes removing from the combined replication and vacuum injection tool a structure comprising the transmissive substrates, the passive optical elements, the spacer features and the interior wall features. The resulting structure can be used to form individual modules having a plurality of optical channels, each channel including a respective transmissive cover at a different height within the module.

In some implementations, singulated transmissive substrates are supported on a sacrificial substrate in a first combined replication and vacuum injection tool. Various ones of the singulated transmissive substrates are supported at a first height and other ones of the singulated transmissive substrates are supported at a second different height.

The details of one or more implementations are set forth in the accompanying drawings and the description below. Other aspects, features, and advantages will be apparent from the description and drawings, and from the claims.

DETAILED DESCRIPTION

Figure 1:
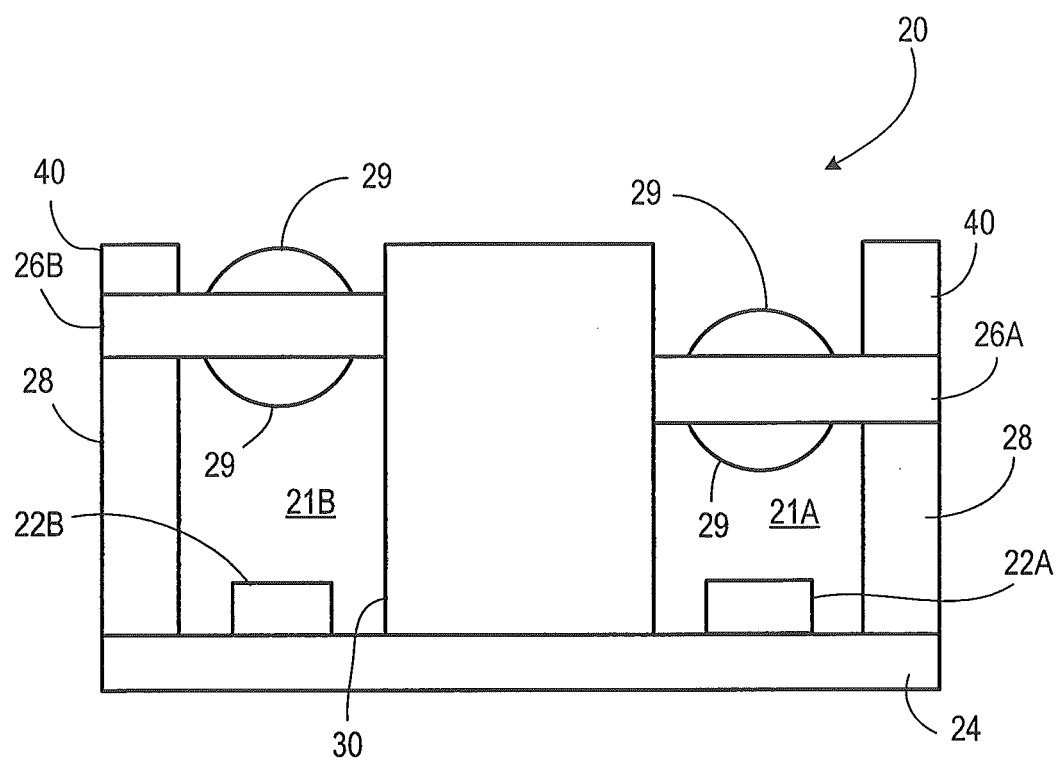
FIG. 1 is a cross-section illustrating of an example of an optoelectronic module according to the invention.

As illustrated in FIG. 1, a module 20 includes first and second optoelectronic devices 22A, 22B mounted on a printed circuit board (PCB) or other support substrate 24. In the illustrated example, the first optoelectronic device 22A includes a light emitting element such as a LED, an IR LED, an OLED, an IR laser or a VCSEL. The second optoelectronic device 22B includes a light detecting element such as a photodiode, CCD or other light sensor that is arranged to detect light at one or more wavelengths (e.g., infra-red) emitted by the light emitting device. The module 20 thus has two optical channels 21A, 21B, one for light emission and one for light detection. In other implementations, instead of a light emission channel and a light detection channel, the module may include, for example, two or more light emission channels with corresponding light emitting devices or two or more light detection channels with corresponding light detection devices.

The devices 22A, 22B are protected respectively by transmissive covers 26A, 26B. The covers 26A, 26B are aligned, respectively, with the module's optical emission and detection channels 21A, 21B and can be composed of a material (e.g., glass, sapphire or a polymer) that is transparent to the wavelength(s) of light emitted by the light emitting device 22A and detectable by the light detecting device 22B (e.g., infra-red or near infra-red).

In some implementations, optical elements such as lenses or diffusers are disposed on one or both of the top and bottom sides of each transmissive cover 26A, 26B. As shown in FIG. 1, a first pair of lenses 29 is aligned with the optical emission channel 21A, and a second pair of lenses 29 is aligned with the optical detection channel 21B. The optical elements 29 can be formed, for example, by a replication technique.

The transmissive covers 26A, 26B can be positioned at different heights over the support substrate 24. Placing the transmissive covers 26A, 26B at different heights can allow greater flexibility in the optical design of the module. For example, in some implementations, it may be desirable for the emission and detection channels 21A, 21B to have respective focal lengths that differ from one another. For example, the emission channel 21A may have a first focal length, whereas the detection channel 21B may have a second, different, focal length. The different focal lengths can be achieved by having the respective covers 26A, 26B placed at different heights above the respective devices 22A, 22B. Thus, in the example of FIG. 1, the cover 26A over the light emitting device 22A is located closer to the support substrate 24 than is the cover 26B over the light detecting device 22B. In other implementations, the cover 26A over the light emitting device 22A may be located further from the support substrate 24 than is the cover 26B over the light detecting device 22B.

Placing the transmissive covers 26A, 26B at different heights also can achieve additional or different advantages in some implementations. For example, in some cases, the optical channels 21A, 21B have the same focal length, but different heights of the devices 22A, 22B can be compensated for by positioning the transmissive covers at different heights above the support substrate 24. Further, the transmissive covers 26A, 26B can be made of different materials or have different thicknesses from one another.

The covers 26A, 26B are separated from the substrate 24 by a spacer 28, which laterally encircles the devices 22A, 22B. The spacer 28 preferably is composed of a non-transparent material and serves as exterior sidewalls for the module 20. Because the covers 26A, 26B are located at different heights above the support substrate 24, the height of the spacer 28 is greater in the region surrounding the channel 21B, and lower in the region surrounding the channel 21A.

The module 20 also includes an interior wall 30 that separates the emission and detection channels 21A, 21B from one another. The interior wall 30 can be composed, for example, of the same non-transparent material as the spacer 28. These features can help reduce optical cross-talk between the channels 21A, 21B and can help reduce the amount of stray light entering the module. In some implementations, a baffle 40 is provided over the covers 26A, 26B to reduce stray light and/or optical cross-talk even further. The baffle 40 also form the upper part of the module's outer walls. The interior wall 30 can extend upwardly such that it reaches the same height above the substrate support 24 as does the top of the baffle 40. Like the spacer 28, different regions of the baffle 40 have different lengths. Thus, in the illustrated example, the length of the baffle 40 in the region encircling the upper portion of the detection channel is less than the length of the baffle in the region encircling the upper portion of the emission channel.

The optoelectronic devices 22A, 22B can be mounted to the substrate 24, for example, using flip chip technology or wire bonding technology. In some implementations, the underside of the devices 22A, 22B can include conductive contacts that electrically couple the optoelectronic devices 22A, 22B to conductive pads on the surface of the support substrate 24. The support substrate 24, in turn, can include plated conductive vias that extend from the conductive pads vertically through the substrate 24 and that are coupled to one or more solder balls or other conductive contacts on the exterior side of the substrate 24. The conductive contacts on the exterior of the support substrate 24 allow the module 20 to be mounted, for example, on a printed circuit board in a handheld device such as a mobile phone, tablet or other consumer electronic device.

Modules such as the one illustrated in FIG. 1 and described above can be fabricated, for example, in a wafer-level process. Wafer-level processes allow multiple modules 20 can be fabricated at the same time. Generally, a wafer refers to a substantially disk- or plate-like shaped item, its extension in one direction (z-direction or vertical direction) is small with respect to its extension in the other two directions (x- and y- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction.

Figure 2:
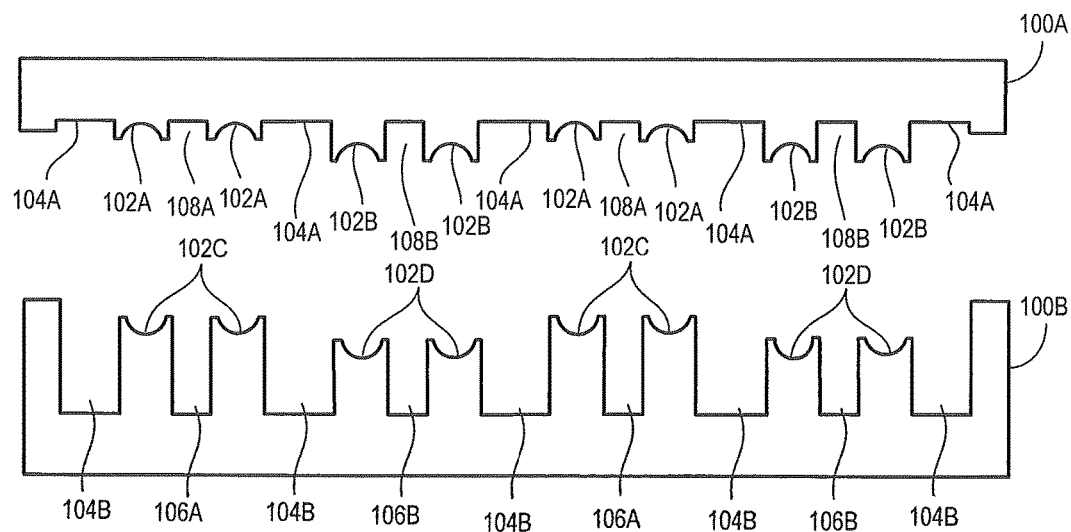
FIGS. 2-7 illustrate steps in a wafer-level fabrication process for making multiple modules as in FIG. 1.
Figure 3:
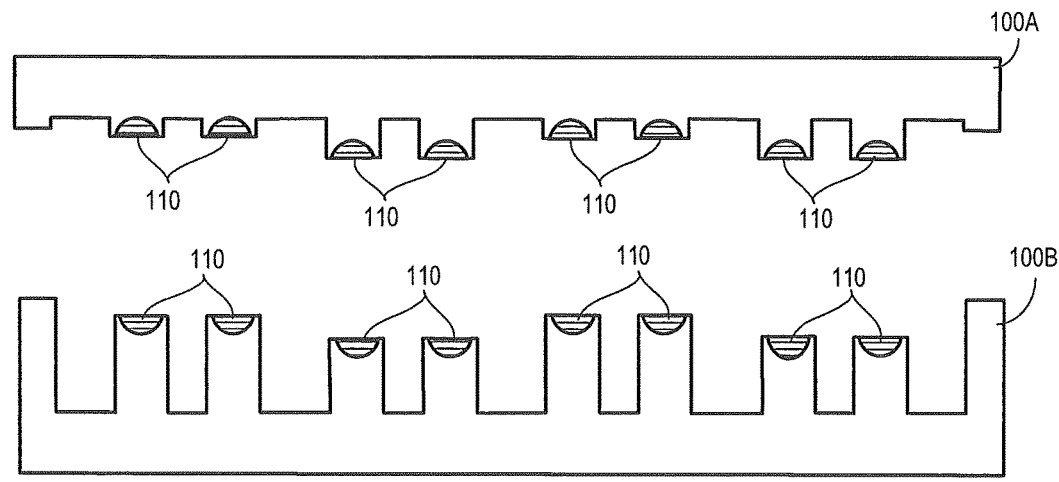

FIGS. 2-7 illustrate an example of a wafer-level technique for fabricating modules like the module 20 of FIG. 1. In particular, FIGS. 2-6 illustrate steps for forming passive optical elements (e.g., lenses) on transmissive substrates, as well as forming spacer features, baffle features and interior wall features. As shown in FIG. 2, these features can be formed using upper and lower PDMS tools 100A, 100B that facilitate formation of the passive optical elements by replicating them onto transmissive substrates, and formation of the spacer, baffle and interior wall features by a vacuum injection technique. The upper tool 100A includes replication features 102A, 102B that correspond to the passive optical elements (e.g., lenses) that are to be formed on the upper surface of transmissive substrates. Likewise, the lower tool 100B includes replication features 102C, 102D that correspond to the passive optical elements (e.g., lenses) that are to be formed on the lower surface of the transmissive substrates. The lens replication features 102A, 102B of the upper tool 100A are at different heights; similarly, the lens replication features 102C, 102D of the lower tool 100B are at different heights. Collectively, the lens replications features 102A, 102B, 102C and 102D correspond to the various lenses that are formed on either side of the transmissive substrates.

The upper and lower tools 100A, 100B also include respective spaces 104A, 104B that correspond to regions for the interior wall features of the modules. Further, the lower tool 100B includes spaces 106A, 106B that correspond to regions for the spacer features of the modules. The upper tool 100A includes spaces 108A, 108B that correspond to regions for the baffle features of the modules.

Figure 4:
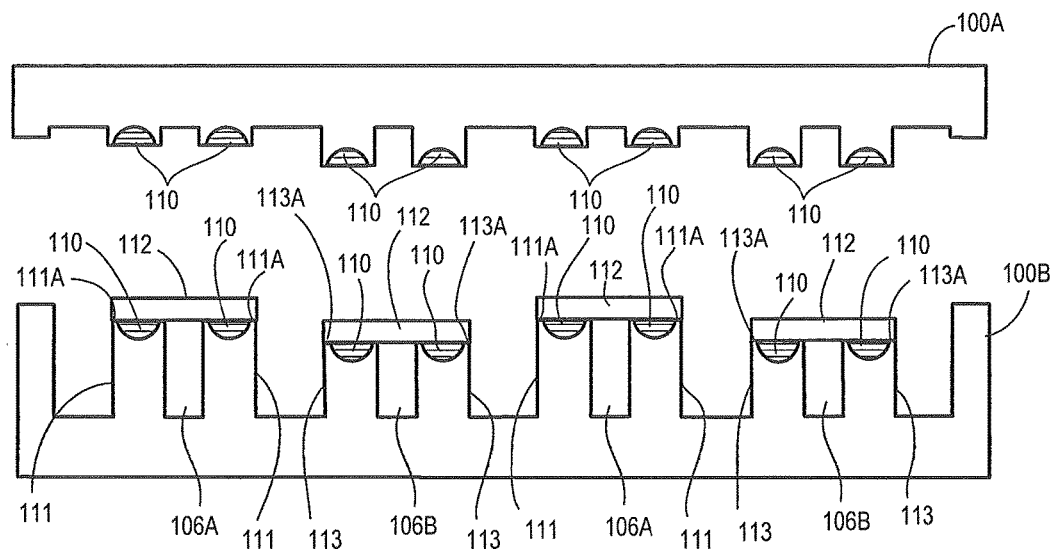

To form the lens elements, a curable epoxy is dispensed on the replication features 102A, 102B of the upper tool 100A, as well as on the replication features 102C, 102D of the lower tool 100B. See FIG. 3. Also, as shown in FIG. 4, a singulated transmissive substrate 112 is placed over each region of curable epoxy 110 on the lower tool 100A. Preferably, each singulated transmissive substrate 112 spans across two adjacent regions of epoxy 110 that are at the same height as one another and that are separated by one of the spaces 106A or 106B. In other cases, a separate singulated transmissive substrate is provided for each respective optical channel. As shown in the illustrated example, the tool 100B has some platforms 111 having an upper surface 111A to support some of the singulated transmissive substrates 112 at the first height, and other platforms 113 having an upper surface 113A to support other ones of the singulated transmissive substrates 112 at the second height. The result is that each substrate 112 is at a different height relative to an adjacent substrate 112. An advantage of having the transmissive substrates 112 span across the regions for two adjacent optical channels is that it can increase stability during fabrication. Using such wider substrates 112 also can make it easier to place the singulated substrates 112 using, for example, pick-and-place equipment. The substrates 112 can be composed, for example, of glass, sapphire or a polymer that is transparent to the particular wavelength(s) of interest.

Figure 5:
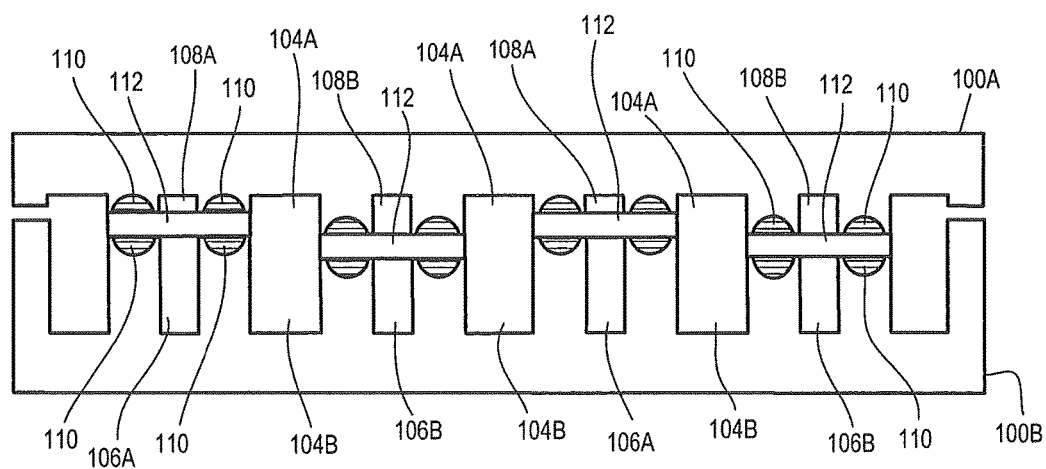
Figure 6:
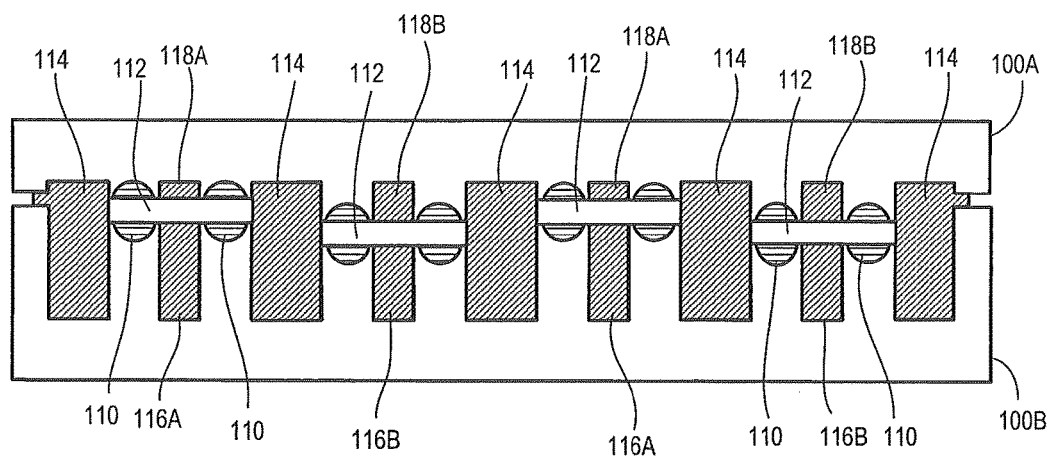

Next, as illustrated in FIG. 5, the upper and lower tools 100A, 100B are aligned with one another and brought into contact so that the epoxy material 110 on the replication features 102A, 102B of the upper tool 100A comes into contact with the top surfaces of the respective transmissive substrates 112. The epoxy material 110 for the lenses then is hardened, for example, by UV or thermal curing. When subsequently cured, the epoxy material 110 should be transparent (at least to wavelengths of light that are to be emitted from or detected by the module).

Figure 7:
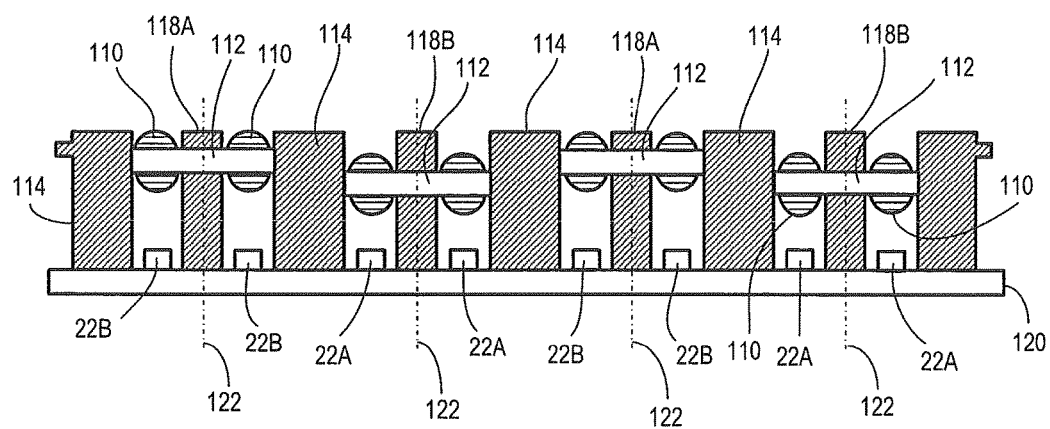

Next, a non-transparent curable material is provided by vacuum injection in the spaces 104A, 104B, 106A, 106B, 108A, 108B between the tools 100A, 100B, such that the spaces are filled with the non-transparent material. The non-transparent material can be composed, for example, of a flowable polymer material (e.g., epoxy, acrylate, polyurethane, or silicone) containing a non-transparent filler (e.g., carbon black, a pigment, an inorganic filler, or a dye). See FIG. 6. The non-transparent material subsequently is hardened (e.g., by UV or thermal curing). As shown, in FIG. 6, the hardened non-transparent material forms interior wall features 114, baffle features 118A, 118B and spacer features 116A, 116B. The tools 100A, 100B then can be removed. The resulting structure (comprising the transmissive substrates 112, the lenses 110, the spacer features 116A, 116B, the baffle features 118A, 118B and the interior wall features 114) can be attached to a substrate wafer 120 on which are mounted optoelectronic devices (i.e., light emitting devices 22A and light detecting devices 22B), as shown in FIG. 7.

The substrate wafer 120 can be, for example, of a PCB wafer. The resulting stack can be separated (e.g., by dicing) along lines 122 into multiple modules like module 20, each of which includes a light emitting device 22A and a light detecting device 22B in respective optical channels having optical elements (e.g., transparent covers and lenses) located at different heights above the substrate support.

In some implementations, the structure removed from the tools 100A, 100B can be diced prior to attachment to the substrate wafer 120. Also, in some implementations, instead of attaching the structure removed from the tools 100A, 100B to a substrate wafer 120 on which are mounted multiple light emitting and light detecting devices 22A, 22B, singulated optoelectronic devices 22A, 22B can be attached to the structure. The foregoing methods can enable testing of the optical and/or optoelectronic components prior to assembly (i.e., prior to attachment of the support on which the devices 22A, 22B are mounted to the structure removed from the tools 100A, 100B).

Figure 8:
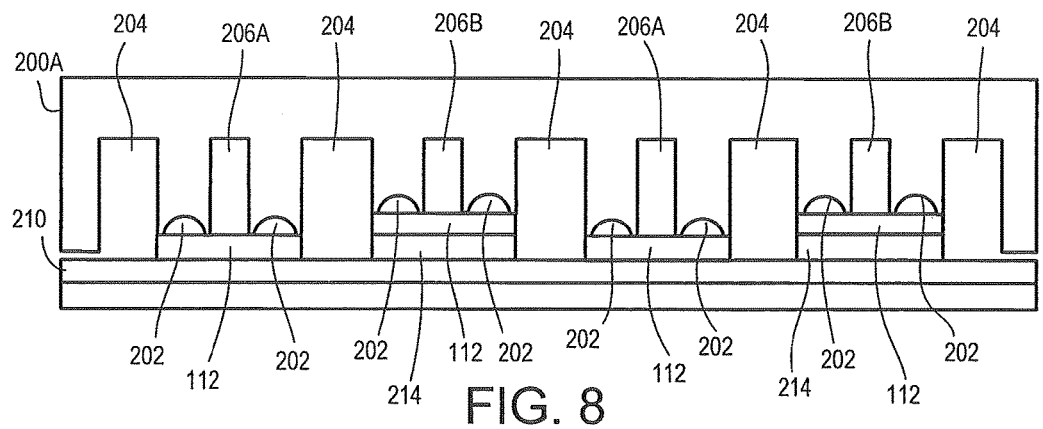
FIGS. 8-13 illustrate steps in another wafer-level fabrication process for making multiple modules as in FIG. 1.
Figure 9:
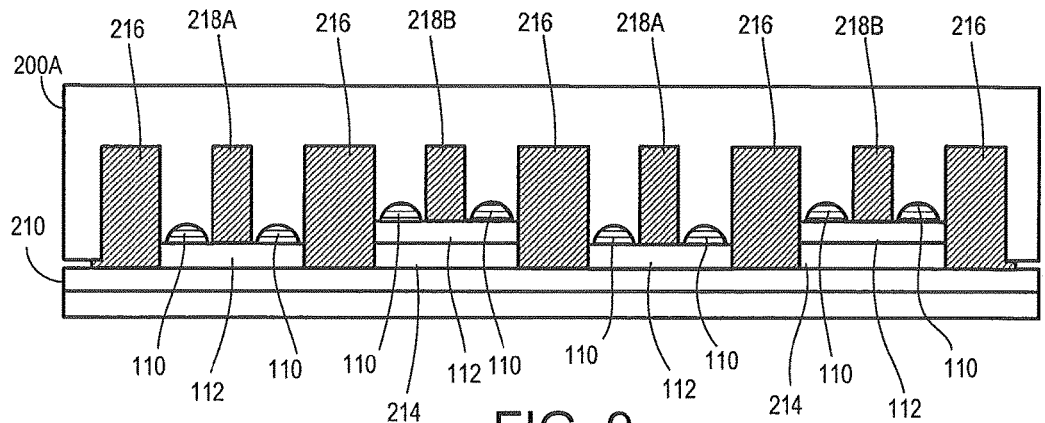
Figure 10:
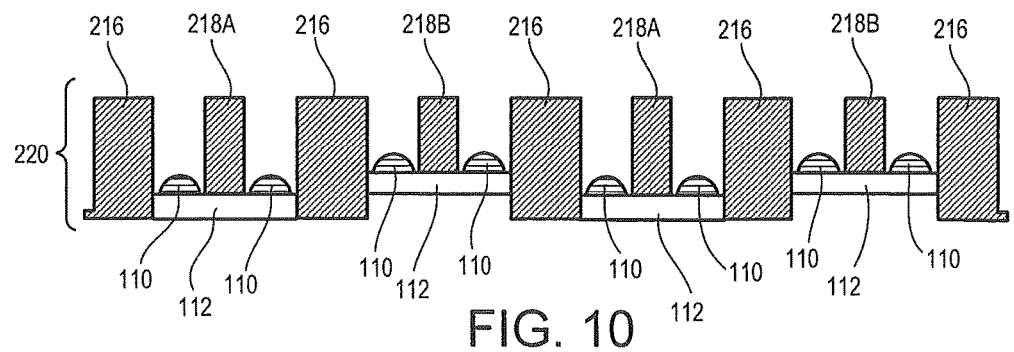

FIGS. 8-13 illustrate another wafer-level fabrication technique for manufacturing multiple modules such as the module 20 of FIG. 1. In this case, as shown in FIG. 8, multiple singulated transmissive substrates 112 are mounted over a sacrificial substrate 210. Some of the transmissive substrates 112 can be mounted directly to the sacrificial substrate 210, whereas others are mounted on a raised platform 214, which in turn, is mounted to the sacrificial substrate 210. As before, the transmissive substrates 112 can be composed, for example, of glass, sapphire or a polymer that is transparent to the wavelength(s) of interest (i.e., the wavelength(s) of light emitted by the light emitting devices 22A and detectable by the light detecting devices 22B). A combined replication and vacuum injection tool 200A is provided, and a curable epoxy material is dispensed on the replication features 202 of the tool, which then is brought into contact with the exposed surfaces of the transmissive substrates 112 to form replicated lens elements 110 as shown in FIG. 9. The epoxy material then is hardened, for example, by thermal or UV curing. Also, the spaces 204 between the tool 200A and the sacrificial substrate 210, as well as the spaces 206A, 206B between the tool 200A and the transmissive substrates 212, are filled with a non-transparent material such as a flowable polymer material (e.g., epoxy, acrylate, polyurethane, or silicone) containing a non-transparent filler (e.g., carbon black, a pigment, an inorganic filler, or a dye). See FIG. 9. The non-transparent material subsequently can be hardened (e.g., by UV or thermal curing) to form interior wall features 216 and spacer features 218A, 218B. The tool 200A and the sacrificial substrate 210 then are removed. The resulting structure 220 comprising the transmissive substrates 112, the lenses 110, the spacer features 218A, 218B, and the interior wall features 216) is illustrated in FIG. 10.

Figure 11:
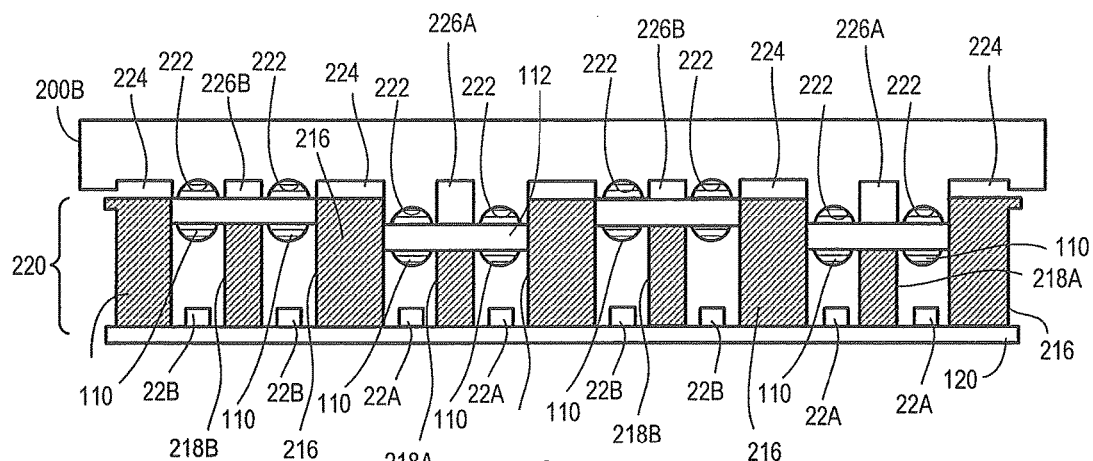
Figure 12:
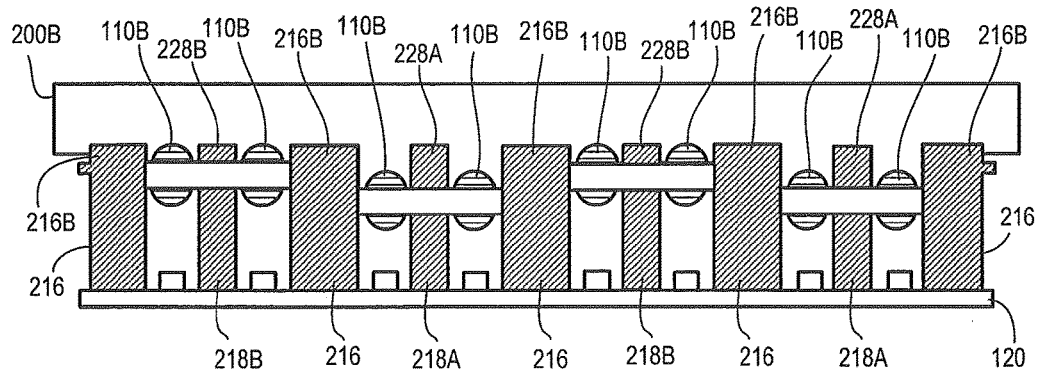
Figure 13:
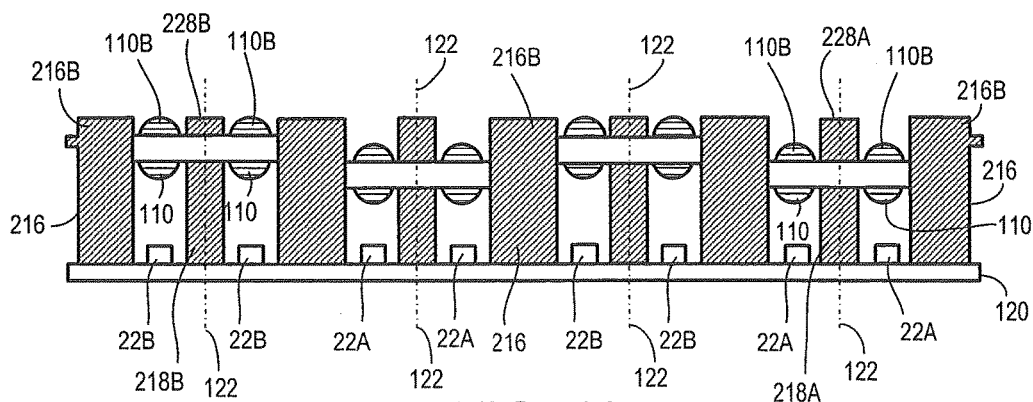

The structure 220 then is mounted on a substrate wafer 120 (e.g., a PCB wafer) on which are mounted optoelectronic devices (i.e., light emitting devices 22A and light detecting devices 22B), as shown in FIG. 11. A second combined replication and vacuum injection tool 200B can be used to form lenses on the second side of the transmissive substrates 112, the baffle features and the upper portion of the interior wall features 216. A curable epoxy material is dispensed on replication features 222 of the tool 200B, which then is brought into contact with the exposed surfaces of the transmissive substrates 112 to form replicated lens elements 110B as shown in FIG. 12. The epoxy material can be hardened, for example, by thermal or UV curing. Also, the spaces 224 between the tool 200B and the previously-formed sections 216 of the interior wall features, as well as the spaces 226A, 226B between the tool 200B and the transmissive substrates 112, are filled with a non-transparent material such as a flowable polymer material (e.g., epoxy, acrylate, polyurethane, or silicone) containing a non-transparent filler (e.g., carbon black, a pigment, an inorganic filler, or a dye). See FIG. 12. The non-transparent material subsequently can be hardened (e.g., by UV or thermal curing) to form the upper sections 216B of interior wall features 216 and to form baffle features 228A, 228B. The second tool 200B then can be removed. The resulting structure, which is illustrated in FIG. 13, can be separated (e.g., by dicing) into multiple modules like the module 20 of FIG. 1.

In some implementations, the structure removed from the tool 200A (see FIG. 10) can be diced prior to attachment to the substrate wafer 120. Also, in some implementations, instead of attaching the structure removed from the tools to a substrate wafer 120 on which are mounted multiple light emitting and light detecting devices 22A, 22B, singulated optoelectronic devices 22A, 22B can be attached to the structure. The foregoing methods can enable testing of the optical and/or optoelectronic components prior to assembly (i.e., prior to attachment of the support on which the devices 22A, 22B are mounted to the structure removed from the tool 200A).

Figure 14:
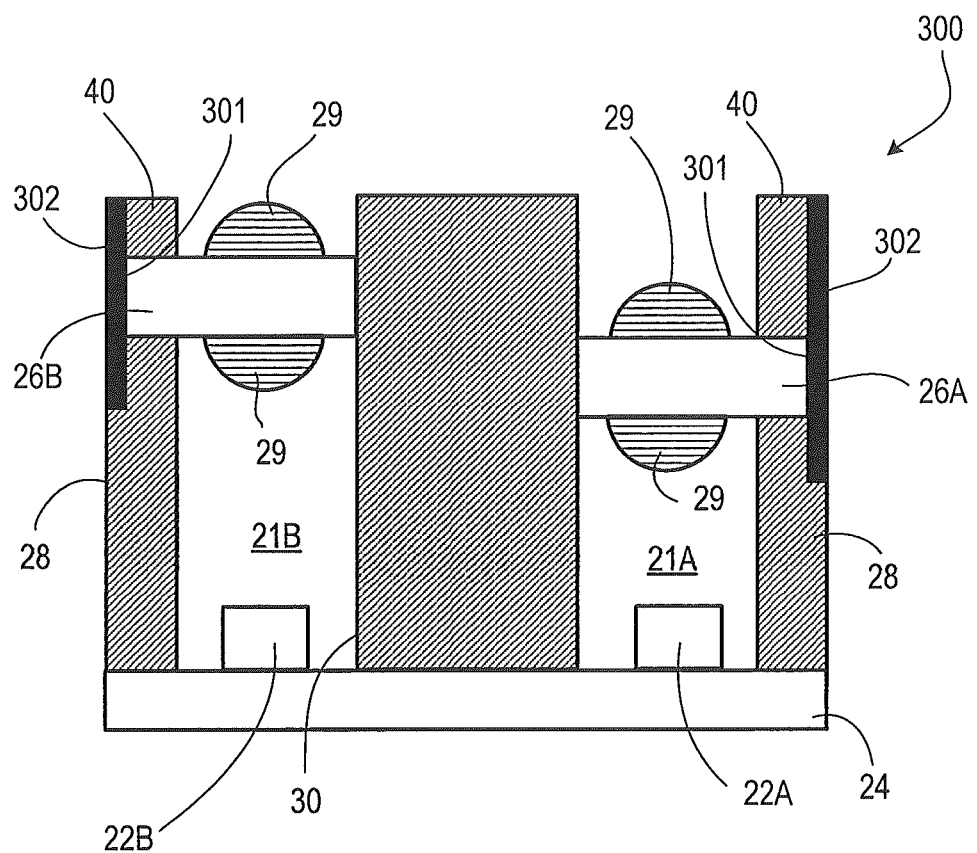
FIG. 14 is a cross-section illustrating another example of an optoelectronic module according to the invention.

In the example of FIG. 1, edges of the transmissive covers 26A, 26B are substantially flush with the outer sides of the spacer 28 and the baffle 40. In some implementations, it may be desirable to prevent light from leaking out through the side edges of the transmissive covers. In that case, before separating the structures of FIG. 5 or FIG. 13 into individual modules, additional processing can be performed so that the side edges of the transmissive covers 26A, 26B are covered by a non-transparent material. FIG. 14 shows an example of such a module 300, which is similar to the module 20 of FIG. 1 except that the outer side edge 301 of each transmissive cover 26A, 26B is covered by an exterior wall 302 that is non-transparent to wavelength(s) of light that are emitted by or detectable by the devices 22A, 22B. The material of the exterior walls 302 can be the same as or different from the non-transparent material of the spacer 28 and baffle 40.

Figure 15:
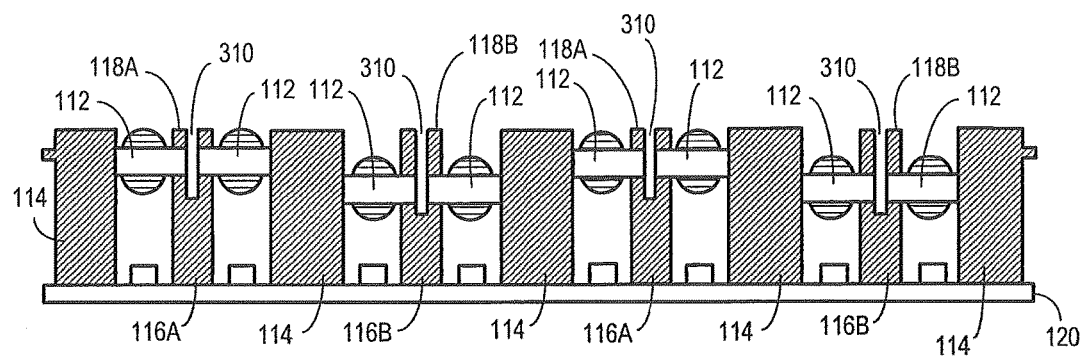
FIGS. 15-16 illustrate steps in a wafer-level fabrication process for making multiple modules as in FIG. 14.
Figure 16:
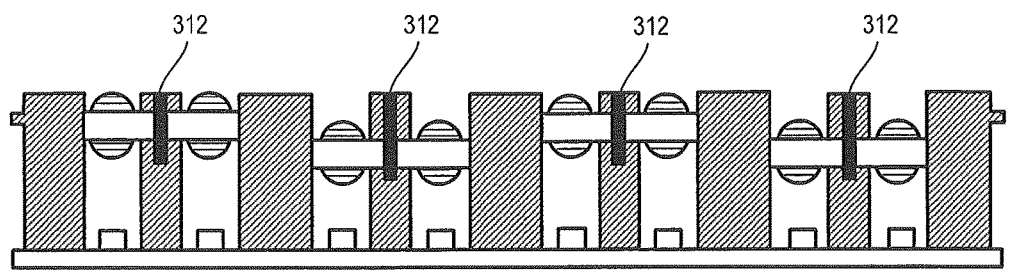
Figure 17:
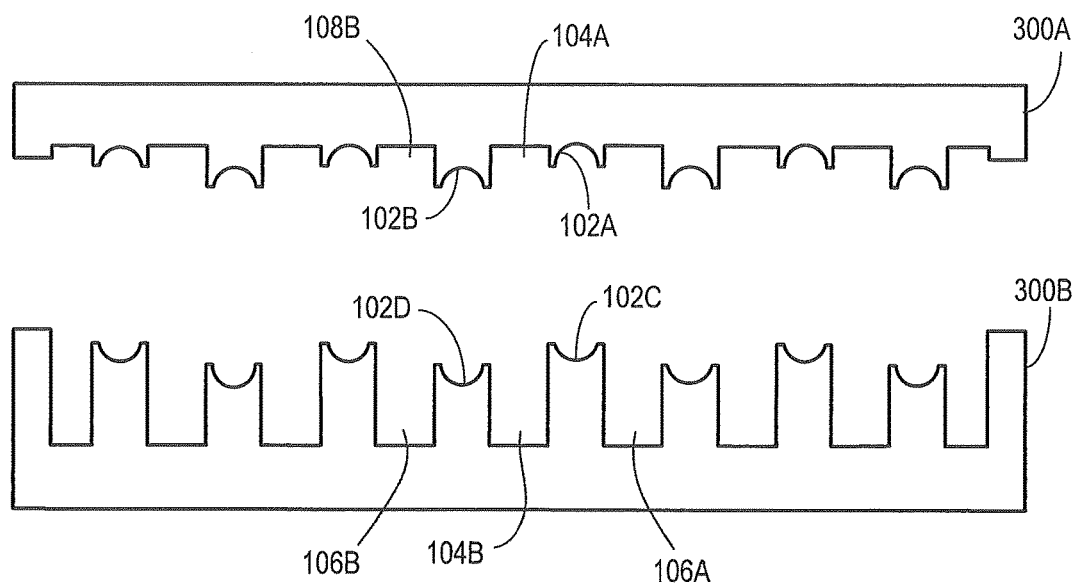
FIGS. 17-22 illustrate steps in accordance with a further wafer-level fabrication process.
Figure 18:
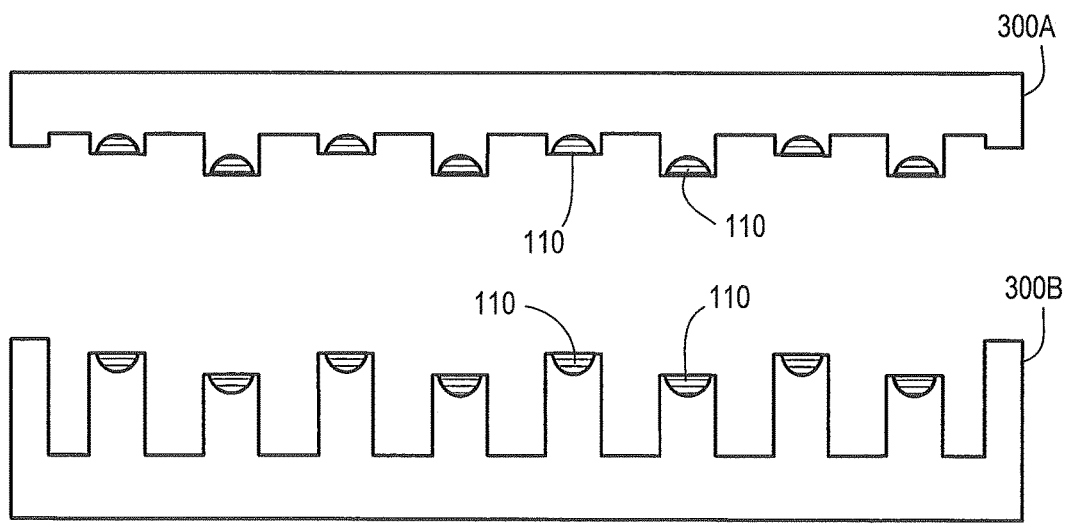

One way in which the side edges 301 of the transmissive covers 26A, 26B can be covered with non-transparent material is illustrated by FIGS. 15 and 16. Starting, for example, with the structure of FIG. 7, openings (e.g., trenches) 310 are formed from the top of each baffle feature 118A, 118B through the underlying transmissive substrates 112, as shown in FIG. 15. The trenches 310 should extend entirely through the thickness of the transmissive substrates 112 and, preferably, should extend partially into spacer features 116A, 116B below. The trenches 310 can be formed, for example, by dicing, micromachining or laser cutting techniques. The trenches 310 subsequently can be filled with a non-transparent material 312 using, for example, a vacuum injection technique so as to provide a non-transparent layer on the side edges of the various portions of the transmissive substrates 112. See FIG. 16. The vacuum injection technique can involve placing a PDMS tool on the top of the structure shown in FIG. 15. The non-transparent material covering the side edges of the transmissive substrates 112 can be, for example, a curable polymer material (e.g., epoxy, acrylate, polyurethane, or silicone) containing a non-transparent filler (e.g., carbon black, pigment, or dye). The structure of FIG. 16 then can be separated (e.g., by dicing) into multiple individual modules such as the module 300 of FIG. 14.

Figure 19:
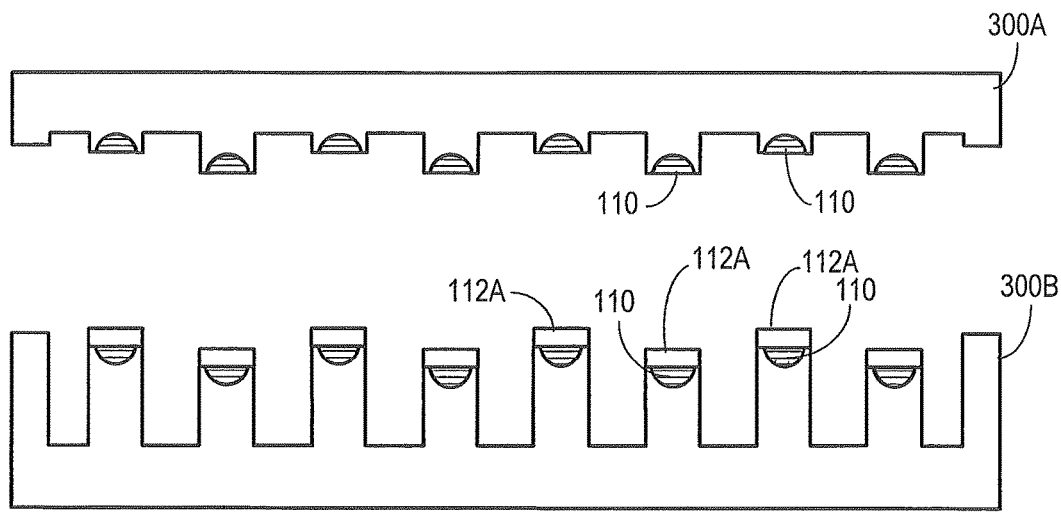
Figure 20:
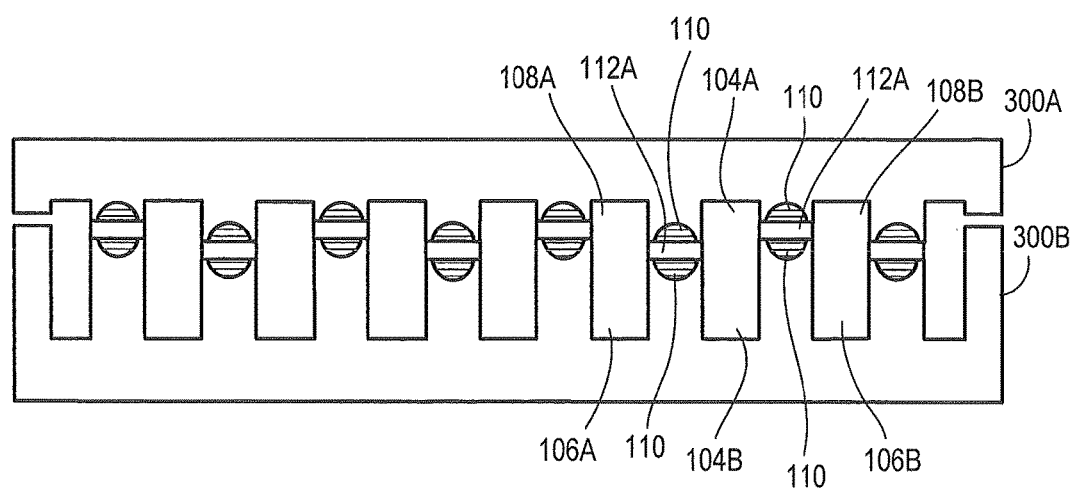
Figure 21:
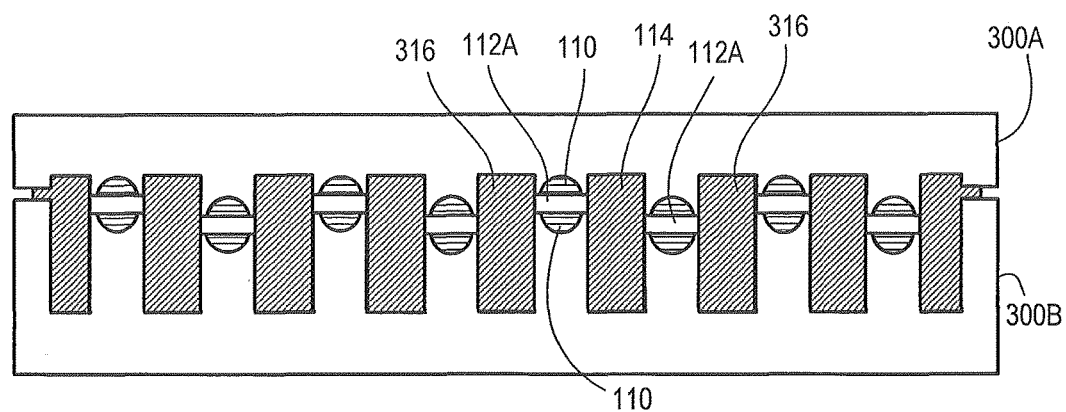
Figure 22:
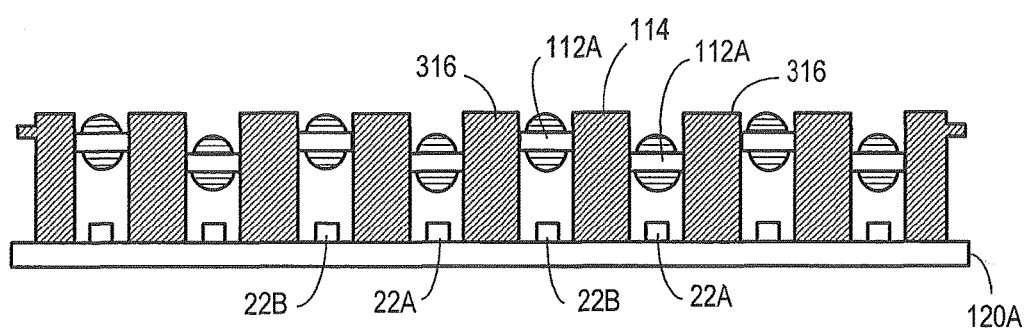

As previously noted, in some implementations of the fabrication process, it can be desirable to use transmissive substrates 112 that span across the regions for two adjacent optical channels. Nevertheless, other implementations can use singulated transmissive substrates each of which is placed over a respective single individual optical channel. An example of such a fabrication process is illustrated in FIGS. 17 through 22 and corresponds generally to the process of FIGS. 2 through 7, with the following modifications. As in the previous process, combined replication and vacuum injection tools 300A, 300B tools can be used. Instead, however, of using transmissive substrates 112 that span across the regions for two adjacent optical channels (as in FIG. 4), a different singulated transmissive substrate 112A is placed over each channel, as shown in FIG. 19. The passive optical elements 110 (e.g., lenses) can be replicated onto both sides of each transmissive substrate 112A (see FIG. 20) in the same manner as described previously. The spaces 104A, 104B, 106A, 106B, 108A, 108B between the tools 300A, 300B then are filled with a non-transparent curable material by vacuum injection (see FIG. 21) as previously described. Curing the non-transparent material forms interior wall features 114 and exterior walls features 316, 316. The tools 300A, 300B then can be removed. The resulting structure (comprising the transmissive substrates 112, the lenses 110, the interior wall features 114 and the exterior wall features 316) can be processed in any of the manners described above with respect to the structure obtained from the tools 100A, 100B in FIG. 6 (e.g., attaching light emitting and light detecting devices 22A, 22B; dicing). In some implementations, the transmissive substrates can placed on a tool having platforms as described, for example, in connection with FIGS. 8 and 9.

Figure 23:
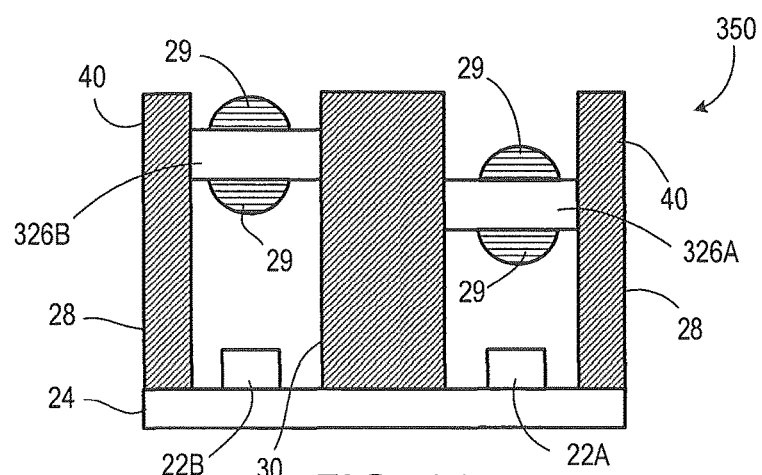
FIG. 23 is a cross-section of another optoelectronic module according to the invention.

An example of a module 350 that can be obtained using the fabrication process of FIGS. 17-22 is illustrated in FIG. 23. The module 350 is similar to the module 20 of FIG. 1, except that the outer side edges of the transmissive covers 326A, 326B are completely covered by the exterior walls defined by the spacer 28 and baffle 40, which are no longer separated from one another by the transmissive covers. The module 350, like the other modules described above, has multiple optical channels 21A, 21B with respective covers 26A, 26B located at different heights above the support substrate 24.

In the foregoing examples, the transmissive covers 26A, 26B are substantially parallel to the support substrate 24 on which the devices 22A, 22B are mounted. In some implementations, however, the transmissive covers 26A, 26B can be tilted (i.e., inclined) with respect to the support substrate 24. This feature can allow further flexibility in the optical design. An example of a module that includes such tilted transmissive covers is illustrated in FIG. 24.

Figure 24:
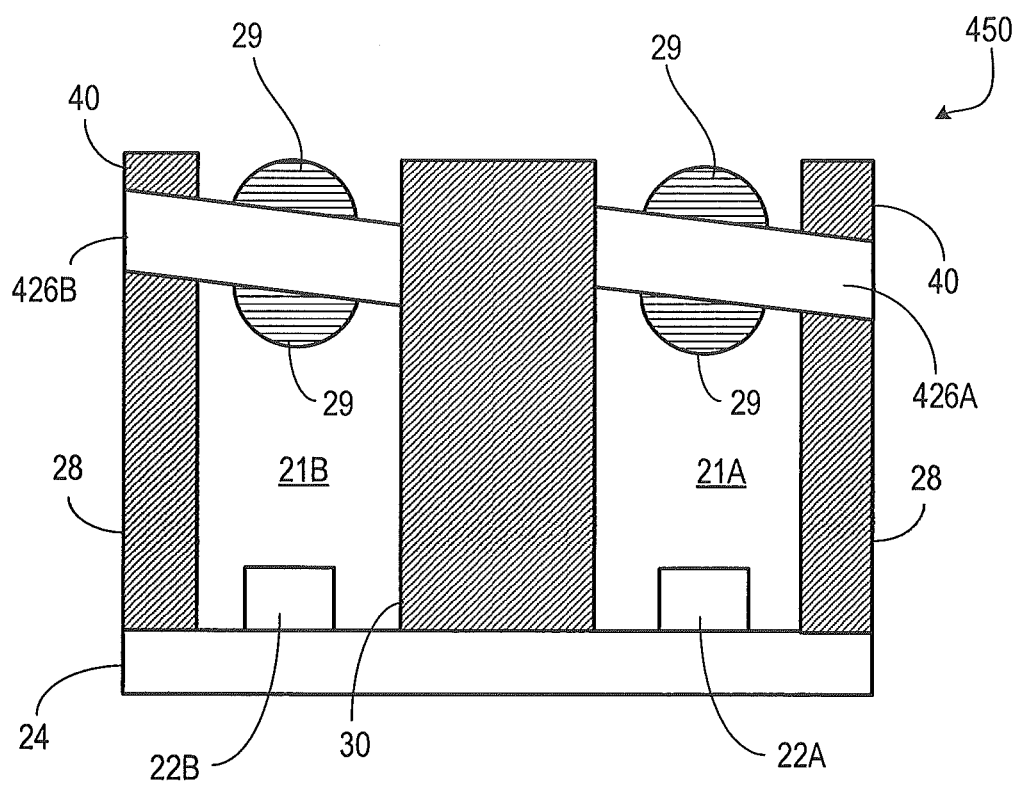
FIG. 24 is a cross-section of yet another optoelectronic module according to the invention.

As illustrated in FIG. 24, a module 450 is similar to the module 20 of FIG. 1, except that the transmissive covers 426A, 426B over the respective devices 22A, 22B are tilted at a slight incline with respect to the support substrate 24. Here too, the transmissive covers 426A, 426B are disposed at different heights above the support substrate 24. In the illustrated example, the transmissive cover 26A over the light emitting device 22A is positioned slightly higher than the transmissive cover 426B over the light detecting device 22B. More generally, for all the module designs described above, including the implementation of FIG. 24, depending on the design requirements for the module, it is possible for the transmissive cover in the optical emission channel to be either higher or lower than the transmissive cover in the optical detection channel.

Figure 25:
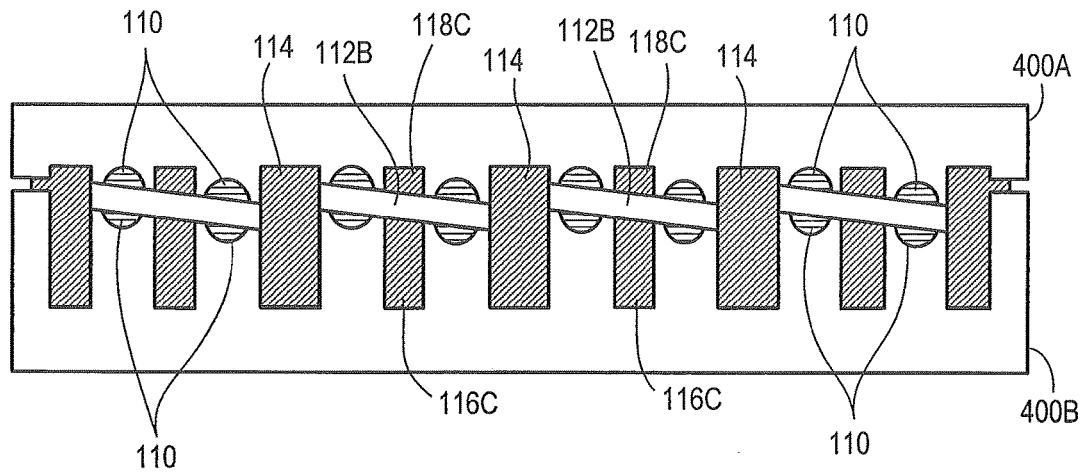
FIGS. 25 and 26 illustrate steps in accordance with a wafer-level fabrication technique for making the module of FIG. 24.

Fabrication techniques similar to those described above can be used to manufacture the module 450 of FIG. 24. For example, steps similar to the process of FIGS. 2-6 can be used, to form passive optical elements (e.g., lenses) on transmissive substrates, as well as to form spacer features, baffle features and interior wall features. Thus, as indicated by FIG. 25, the foregoing features can be formed using upper and lower PDMS tools 400A, 400B that facilitate formation of the passive optical elements 110 by replicating them onto transmissive substrates 112B, and formation of the spacer features 116C, baffle features 118C and interior wall features 114 by a vacuum injection technique. The tools 400A, 400B are adapted such that they support the transmissive substrates 112B at a slight incline.

Figure 26:
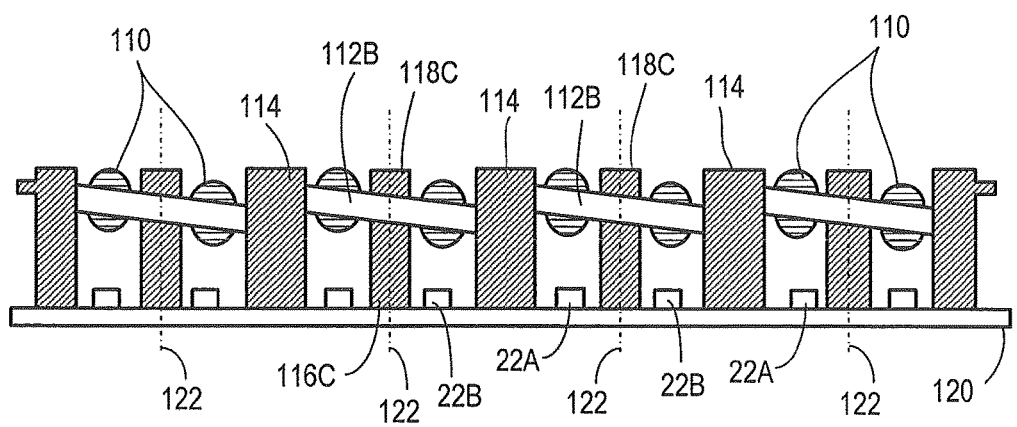

Following performance of the replication and vacuum injection techniques, as well as the UV or thermal curing processes to harden the replication and vacuum injection materials, the resulting structure (comprising the transmissive substrates 112B, the lenses 110, the spacer features 116C, the baffle features 118C and the interior wall features 114) can be attached to a substrate wafer 120 on which are mounted optoelectronic devices (i.e., light emitting devices 22A and light detecting devices 22B), as shown in FIG. 26. The resulting stack can be separated (e.g., by dicing) along lines 122 into multiple modules like module 450, each of which includes a light emitting device 22A and a light detecting device 22B in respective optical channels having optical elements (e.g., transparent covers and lenses) located at different heights above the substrate support.

In some implementations, the structure removed from the tools 400A, 400B can be diced prior to attachment to the substrate wafer 120. Also, in some implementations, instead of attaching the structure removed from the tools 400A, 400B to a substrate wafer 120 on which are mounted multiple light emitting and light detecting devices 22A, 22B, singulated optoelectronic devices 22A, 22B can be attached to the structure. As explained above, these methods can enable testing of the optical and/or optoelectronic components prior to assembly (i.e., prior to attachment of the support on which the devices 22A, 22B are mounted to the structure removed from the tools 400A, 400B).

Further, in the implementation of FIG. 25 each singulated transmissive substrate 112B spans across two adjacent regions of epoxy 110 that are at the same height as one another and that are separated by one of the spaces 106A or 106B. In other cases, a separate singulated transmissive substrate can be provided for each respective optical channel.

In the foregoing illustrated examples, the interior wall (e.g., 30 in FIGS. 1, 14, 23 and 24) that separates the optoelectronic devices 22A, 22B from one another is shown as wider than the module's exterior walls 28. Although that may be the case in some implementations, in other cases, the width of the interior wall may be about the same as, or less than, the width of the exterior walls. In general, the widths of the walls may depend on the particular implementation, and may take into account various factors (e.g., the material of which the walls are composed, the wavelength(s) of light emitted by or detectable by the optoelectronic devices 22A, 22B, and/or the amount of attenuation desired to be attained for any such light).

The modules described here can be useful, for example, as proximity sensor modules or as other optical sensing modules, such as for gesture sensing or recognition. The modules can be integrated into a wide range of electronic and other devices, such as mobile phones, smart phones, cameras, laptops, as well as others.

As used in this disclosure, the terms "transparent," "non-transparent" and "transmissive" are made with reference to the particular wavelength(s) emitted by or detectable by the devices 22A, 22B in the module. Thus, a particular feature, for example, may be considered "non-transparent" even though it may allow light of other wavelengths to pass through.

Various modifications can be made to the foregoing example within the spirit of the invention. Accordingly, other implementations are within the scope of the claims.

What is claimed is:

1. An optoelectronic module comprising:
   a support substrate on which are mounted first and second optoelectronic devices;
   a first planar transmissive cover over the first optoelectronic device but not over the second optoelectronic device, the first transmissive cover disposed at a first height above the support substrate, wherein the first optoelectronic device is a light emitting element operable to emit light through the first transmissive cover;
   a second planar transmissive cover over the second optoelectronic device but not over the first optoelectronic device, the second transmissive cover disposed at a second height above the support substrate, the second height being different from the first height, wherein the second optoelectronic device is a light detecting element operable to detect light received through the second transmissive cover;
   exterior walls laterally encircling the first and second optoelectronic devices, the exterior walls composed of a material that is non-transparent to one or more wavelengths of light emitted by or detectable by the first and second optoelectronic devices, wherein a respective outer side edge of each of the transmissive covers is substantially flush with a respective outer side of the exterior walls; and
   an interior wall separating the first and second optoelectronic devices from one another, the interior wall being composed of a material that is nontransparent to one or more wavelengths of light emitted by or detectable by the first and second optoelectronic devices.

2. The optoelectronic module of claim 1 further including at least one respective passive optical element on at least one of the transmissive covers.

3. The optoelectronic module of claim 1 wherein at least one of the first or second transmissive covers is tilted at an angle with respect to the support substrate.

4. The optoelectronic module of claim 1 wherein the first transmissive cover has a different thickness from a thickness of the second transmissive cover.

5. The optoelectronic module of claim 1 wherein an optical channel for the first optoelectronic device defines a first focal length, and wherein an optical channel for the second optoelectronic device defines a second focal length different from the first focal length.

6. The optoelectronic module of claim 1 wherein the first optoelectronic device includes a light emitting element arranged to emit light through the first transmissive cover, and wherein the second optoelectronic device includes a light detecting element arranged to detect light received through the second transmissive cover.

7. The optoelectronic module of claim 1 wherein the exterior walls separate the support substrate and the transmissive covers from one another.

8. The optoelectronic module of claim 1 wherein a respective side edge of each of the transmissive covers is in contact with the interior wall.

9. The optoelectronic module of claim 1 wherein an outwardly facing side edge of each of the transmissive covers is covered by an exterior wall portion that is nontransparent to one or more wavelengths of light emitted by or detectable by the first and second optoelectronic devices.

10. The optoelectronic module of claim 9 wherein the exterior wall portions covering the outwardly facing side edges of the transmissive covers are composed of a material that is nontransparent to one or more wavelengths of light emitted by or detectable by the first and second optoelectronic devices.

11. The optoelectronic module of claim 1 further including a baffle over the transmissive covers, wherein the baffle is composed of a material that is nontransparent to one or more wavelengths of light emitted by or detectable by the first and second optoelectronic devices.

* * * * *